(12) United States Patent
Kim et al.

(10) Patent No.: US 8,890,329 B2
(45) Date of Patent: Nov. 18, 2014

(54) SEMICONDUCTOR DEVICE

(75) Inventors: Do Hyung Kim, Gyeonggi-do (KR);
Dae Byoung Kang, Seoul (KR); Seung Chul Han, Gyeonggi-do (KR)

(73) Assignee: Amkor Technology, Inc.

( * ) Notice: Subject to any disclaimer, the term of this patent is extended or adjusted under 35 U.S.C. 154(b) by 76 days.

(21) Appl. No.: 13/455,539

(22) Filed: Apr. 25, 2012

(65) Prior Publication Data

US 2012/0273946 A1    Nov. 1, 2012

(30) Foreign Application Priority Data

Apr. 26, 2011    (KR) .................. 10-2011-0038849

(51) Int. Cl.
*H01L 23/52*    (2006.01)
*H01L 23/48*    (2006.01)
(Continued)

(52) U.S. Cl.
CPC ......... *H01L 25/0657* (2013.01); *H01L 23/3128* (2013.01); *H01L 2924/01079* (2013.01); *H01L 2225/0651* (2013.01); *H01L 2224/14181* (2013.01); *H01L 2224/16145* (2013.01); *H01L 2224/48227* (2013.01); *H01L 2225/06517*
(Continued)

(58) Field of Classification Search
USPC .......... 257/621, 774, 777, E23.174, E27.137; 438/109, 126
See application file for complete search history.

(56) References Cited

U.S. PATENT DOCUMENTS 3,868,724 A    2/1975 Perrino
3,916,434 A    10/1975 Garboushian
(Continued)

FOREIGN PATENT DOCUMENTS

JP    05-109975    4/1993
JP    05-136323    6/1993
(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Luan C Thai
(74) *Attorney, Agent, or Firm* — McAndrews, Held & Malloy, Ltd.

(57) ABSTRACT

A semiconductor device entirely having a small height, which performs a fan-out operation for input/output signals and forms a short electrical path is provided. The semiconductor device includes a first semiconductor die having a first surface, a second surface opposed to the first surface, a third surface connecting the first and second surfaces to each other, a first bond pad disposed on the first surface, and a first through electrode passing between the first surface and second surface and electrically connected to the first bond pad. A first redistribution part is disposed under the second surface and includes a first redistribution layer electrically connected to the first through electrode. A second redistribution part is disposed over the first surface and includes a second redistribution layer electrically connected to the first bond pad.

20 Claims, 1 Drawing Sheet

(51) Int. Cl.
*H01L 29/40* (2006.01)
*H01L 23/538* (2006.01)
*H01L 27/146* (2006.01)
*H01L 21/50* (2006.01)
*H01L 21/48* (2006.01)
*H01L 25/065* (2006.01)
*H01L 23/31* (2006.01)
*H01L 23/00* (2006.01)

(52) U.S. Cl.
CPC ........ (2013.01); *H01L 2225/06565* (2013.01); *H01L 2224/16225* (2013.01); *H01L 2924/15173* (2013.01); *H01L 2225/06562* (2013.01); *H01L 2225/06568* (2013.01); *H01L 2225/06572* (2013.03); *H01L 2225/06541* (2013.01); *H01L 24/48* (2013.01); *H01L 2924/15311* (2013.01); *H01L 2224/32145* (2013.01); *H01L 2225/06513* (2013.01); *H01L 2224/32225* (2013.01); *H01L 2224/48091* (2013.01); *H01L 2224/73265* (2013.01); *H01L 24/16* (2013.01); *H01L 24/32* (2013.01); *H01L 2224/13009* (2013.01)
USPC .... 257/777; 257/621; 257/774; 257/E23.174; 257/E27.137; 438/109; 438/126

(56) References Cited

U.S. PATENT DOCUMENTS

| | | |
|---|---|---|
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara et al. |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |

(56) References Cited

U.S. PATENT DOCUMENTS

| | | |
|---|---|---|
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,087,514 B2 | 8/2006 | Shizuno |
| 7,125,744 B2 | 10/2006 | Takehara et al. |
| 7,185,426 B1 | 3/2007 | Hiner et al. |
| 7,189,593 B2 | 3/2007 | Lee |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,420,809 B2 | 9/2008 | Lim et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,825,520 B1 | 11/2010 | Longo et al. |
| 7,838,337 B2* | 11/2010 | Marimuthu et al. ......... 438/110 |
| 7,843,072 B1* | 11/2010 | Park et al. ............. 257/774 |
| 7,960,827 B1 | 6/2011 | Miller, Jr. et al. |
| 8,018,068 B1 | 9/2011 | Scanlan et al. |
| 8,026,587 B1 | 9/2011 | Hiner et al. |
| 8,110,909 B1 | 2/2012 | Hiner et al. |
| 8,203,203 B1 | 6/2012 | Scanlan |
| 8,294,281 B2* | 10/2012 | Yoshida et al. ............. 257/777 |
| 8,399,992 B2* | 3/2013 | Park et al. ............. 257/777 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0134450 A1 | 7/2003 | Lee |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0046002 A1 | 3/2005 | Lee et al. |
| 2005/0139985 A1 | 6/2005 | Takahashi |
| 2005/0242425 A1 | 11/2005 | Leal et al. |
| 2006/0008944 A1 | 1/2006 | Shizuno |
| 2006/0270108 A1 | 11/2006 | Farnworth et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0230887 A1 | 9/2008 | Sun et al. |
| 2009/0102037 A1* | 4/2009 | Kim ........................ 257/686 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", $58^{th}$ ECTC Proceedings, May 2008, Lake Buena Vista FL, 6 pages, IEEE.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Scanlan et al., "Fan Out Build Up Substrate Stackable Package and Method", U.S. Appl. No. 12/573,466, filed Oct. 5, 2009.

Dunlap et al., "Thin Stackable Package and Method", U.S. Appl. No. 12/630,586, filed Dec. 3, 2009.

Kim et al., "Semiconductor Device and Fabricating Method Thereof", U.S. Appl. No. 12/788,845, filed May 27, 2010.

Scanlan et al., "Semiconductor Package Including a Top-Surface Metal Layer for Implementing Circuit Features", U.S. Appl. No. 12/802,715, filed Jun. 10, 2010.

Jung et al., "Wafer Level Fan Out Semiconductor Device and Manufacturing Method Thereof", U.S. Appl. No. 12/939,588, filed Nov. 4, 2010.

Park et al., "Wafer Level Chip Scale Package and Method of Fabricating Wafer Level Chip Scale Package", U.S. Appl. No. 13/286,903, filed Nov. 1, 2011.

* cited by examiner

SEMICONDUCTOR DEVICE

TECHNICAL FIELD

The present application relates to the field of electronics, and more particularly, to methods of forming semiconductor devices and related structures.

BACKGROUND

Electronic products include semiconductor devices. Such electronic products are recently required to have small size and high performance. Along with this trend, semiconductor devices constituting electronic products are lightweight, slim, and compact. In addition, methods of decreasing the height of semiconductor devices without affecting input/output terminals thereof are being continually researched.

BRIEF DESCRIPTION OF THE DRAWINGS

In the following description, the same or similar elements are labeled with the same or similar reference numbers.

DETAILED DESCRIPTION

Figure 1:
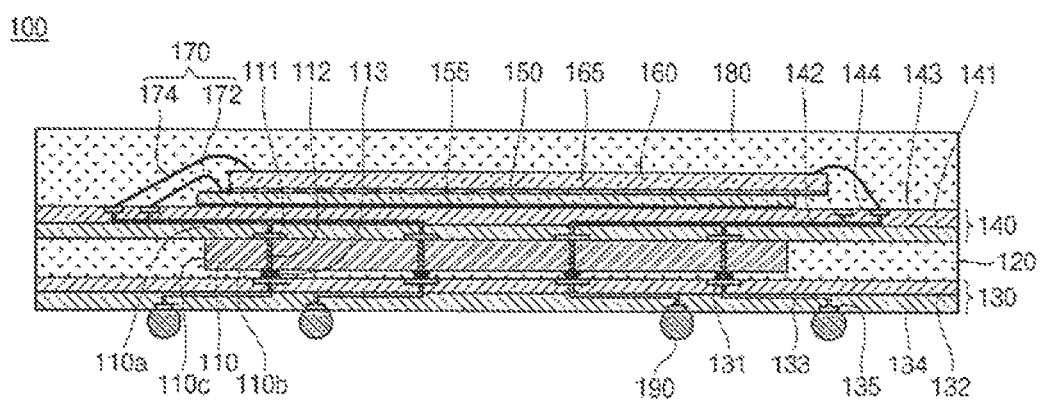
FIG. 1 is a cross-sectional view illustrating a semiconductor device according to an embodiment.

FIG. 1 is a cross-sectional view illustrating a semiconductor device 100 according to an embodiment. Referring to FIG. 1, the semiconductor device 100 according to the current embodiment includes a first semiconductor die 110, a first encapsulant 120, a first redistribution part 130, a second redistribution part 140, a second semiconductor die 150, a third semiconductor die 160, a plurality of conductive wires 170, a second encapsulant 180, and a plurality of solder balls 190.

The first semiconductor die 110 includes a circuit in which transistors, resistors, and capacitors are integrated on a silicon substrate. The first semiconductor die 110 may control an apparatus, or store information. The first semiconductor die 110 has a first surface 110a that is approximately planar, a second surface 110b that is approximately planar and opposed to the first surface 110a, and a third surface 110c that is approximately planar and connects the first and second surfaces 110a and 110b to each other.

The first semiconductor die 110 includes a plurality of first bond pads 111 disposed on the first surface 110a. The first bond pads 111 are formed of a conductive material. The first semiconductor die 110 includes a plurality of first through electrodes 112 passing through a portion between the first and second surfaces 110a and 110b and electrically connecting to the first bond pads 111.

The first through electrodes 112 form electric passages extending from the first bond pads 111 to the second surface 110b. The first through electrodes 112 may be formed of a conductive material, for example, any one selected from gold, silver, copper, and a combination thereof. An insulator (not shown) may be disposed on the first semiconductor die 110 at the outside of the first through electrodes 112. The first semiconductor die 110 may include first conductive bumps 113 disposed on a portion of the first through electrodes 112 exposed through the second surface 110b to electrically connect to a first redistribution layer 133 of the first redistribution part 130.

The first encapsulant 120 is formed on the second and third surfaces 110b and 110c such that the first through electrodes 112 are exposed downward. Since the first conductive bumps 113 are disposed on a portion of the first through electrodes 112, the first encapsulant 120 is formed on the second and third surfaces 110b and 110c such that the first conductive bumps 113 are exposed downward.

The first encapsulant 120 protects the first semiconductor die 110, and provides the upper and lower portions of the first semiconductor die 110 with spaces in which the first and second redistribution parts 130 and 140 greater than the first semiconductor die 110 can be disposed. The first encapsulant 120 may be formed of any one selected from a typical epoxy resin, a typical silicone resin, and an equivalent thereof through a molding process.

The first redistribution part 130 is disposed under the second surface 110b of the first semiconductor die 110. The first redistribution part 130 electrically connects to the first semiconductor die 110, and is greater in width than the first semiconductor die 110 to perform a fan-out operation for input/output signals of the semiconductor device 100. Particularly, the first redistribution part 130 may include a plurality of first upper pads 131, a first passivation layer 132, the first redistribution layer 133, a first dielectric layer 134, and a plurality of first lower pads 135.

The first upper pads 131 contact the first conductive bumps 113 under the first encapsulant 120 to electrically connect to the first through electrodes 112.

The first passivation layer 132 is disposed under the first encapsulant 120 to expose the first upper pads 131. The first passivation layer 132 may be formed of an insulating material.

The first redistribution layer 133 is disposed on the first passivation layer 132 to electrically connect to the first upper pads 131. That is, the first redistribution layer 133 passes through the first passivation layer 132, and extends along the bottom of the first passivation layer 132.

The first redistribution layer 133 electrically connects the first upper pads 131 to the solder balls 190. The first redistribution layer 133 may be formed of any one selected from gold, silver, copper, titanium, nickel, tungsten, and an equivalent thereof, but is not limited thereto.

The first dielectric layer 134 is disposed under the first passivation layer 132 to cover the first redistribution layer 133, thereby protecting the first redistribution layer 133. The first dielectric layer 134 exposes a portion of the first redistribution layer 133 to the lower side thereof. The first dielectric layer 134 may be formed of an insulating material, like the first passivation layer 132.

The first lower pads 135 are disposed on the lower portion of the first dielectric layer 134 to contact the portion of the first redistribution layer 133 exposed to the lower side of the first dielectric layer 134. Accordingly, the first lower pads 135 are exposed to the outside of the lower portion of the first dielectric layer 134.

The second redistribution part 140 is disposed on the first surface 110a of the first semiconductor die 110. The second redistribution part 140 electrically connects to the first semiconductor die 110, and is greater in width than the first semiconductor die 110 to perform, together with the first redistribution part 130, a fan-out operation for input/output signals of the semiconductor device 100. Particularly, the second redistribution part 140 may include a second passivation layer 141, a second redistribution layer 142, a second dielectric layer 143, and a plurality of second upper pads 144.

The second passivation layer 141 is disposed over the first encapsulant 120 to expose the first bond pads 111. The second passivation layer 141 may be formed of an insulating material.

The second redistribution layer 142 is disposed on the second passivation layer 141 to electrically connect to the first bond pads 111. That is, the second redistribution layer 142 passes through the second passivation layer 141, and extends along the top of the second passivation layer 141.

The second redistribution layer 142 electrically connects the first bond pads 111, the second semiconductor die 150, and the third semiconductor die 160 to one another. The second redistribution layer 142 may be formed of any one selected from gold, silver, copper, titanium, nickel, tungsten, and an equivalent thereof, but is not limited thereto.

The second dielectric layer 143 is disposed over the second passivation layer 141 to cover the second redistribution layer 142, thereby protecting the second redistribution layer 142. The second dielectric layer 143 exposes a portion of the second redistribution layer 142 to the upper side thereof. The second dielectric layer 143 may be formed of an insulating material, like the second passivation layer 141.

The second upper pads 144 are disposed on the upper portion of the second dielectric layer 143 to contact the portion of the second redistribution layer 142 exposed to the upper side of the second dielectric layer 143. Accordingly, the second upper pads 144 are exposed to the outside of the upper portion of the second dielectric layer 143.

The first and second redistribution parts 130 and 140 configured as described above, which can replace a typical thick printed circuit board, may perform a fan-out operation for input/output signals of the semiconductor device 100, and decrease a height of the semiconductor device 100.

The second semiconductor die 150 is mounted on the second redistribution part 140 through a first adhesive layer 155, and is electrically connected to the second redistribution part 140. The second semiconductor die 150 may be a typical semiconductor die electrically connected to the second redistribution part 140 by a first conductive wire 172 of the conductive wires 170, but is not limited thereto. The second semiconductor die 150 is smaller in width than the second redistribution part 140.

The third semiconductor die 160 is mounted on the second semiconductor die 150 through a second adhesive layer 165, and is electrically connected to the second redistribution part 140. The third semiconductor die 160 may be a typical semiconductor die electrically connected to the second redistribution part 140 by a second conductive wire 174 of the conductive wires 170, but is not limited thereto. The third semiconductor die 160 is smaller in width than the second redistribution part 140.

The conductive wires 170 include the first and second conductive wires 172 and 174. The first conductive wire 172 is connected to a bonding pad (not shown) of the second semiconductor die 150, and the second upper pad 144 of the second redistribution part 140. The second conductive wire 174 is connected to a bonding pad (not shown) of the third semiconductor die 160, and the second upper pad 144 of the second redistribution part 140.

The second encapsulant 180 encloses the second semiconductor die 150, the third semiconductor die 160, and the conductive wires 170 over the second redistribution part 140. The second encapsulant 180 protects the second semiconductor die 150, the third semiconductor die 160, and the conductive wires 170. The second encapsulant 180 may be formed of any one selected from a typical epoxy resin, a typical silicone resin, and an equivalent thereof through a molding process.

The solder balls 190 are disposed on the first lower pads 135 under the first dielectric layer 134 to electrically connect to the first redistribution layer 133. The solder balls 190 may input and output signals between the first semiconductor die 110 and an external device. The solder balls 190 may be formed of any one selected from Sn—Pb, Sn—Pb—Ag, Sn—Pb—Bi, Sn—Cu, Sn—Ag, Sn—Bi, Sn—Ag—Cu, Sn—Ag—Bi, Sn—Zn, and an equivalent thereof, but are not limited thereto.

As described above, the semiconductor device 100 includes the first and second redistribution parts 130 and 140 greater in width than the first semiconductor die 110, on the upper and lower sides of the first semiconductor die 110 to replace a typical thick printed circuit board, thereby performing a fan-out operation for input/output signals, and decreasing a height of the semiconductor device 100. Furthermore, the semiconductor device 100 may form a short electrical path.

Hereinafter, a semiconductor device will now be described according to another embodiment.

Figure 2:
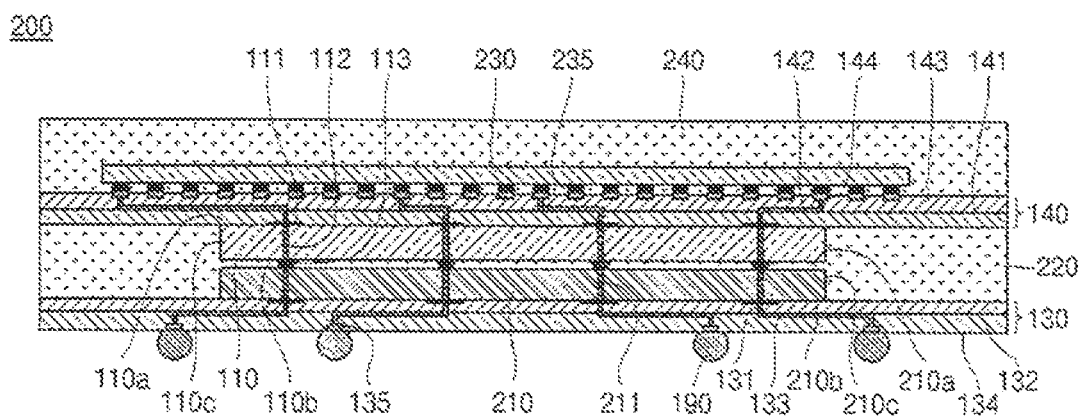
FIG. 2 is a cross-sectional view illustrating a semiconductor device according to another embodiment.

FIG. 2 is a cross-sectional view illustrating a semiconductor device 200 according to an embodiment. The semiconductor device 200 according to the current embodiment is the same in configuration and function as the semiconductor device 100 of FIG. 1 except that the semiconductor device 200 includes an interposer 210, a first encapsulant 220, a flip-type second semiconductor die 230, and a second encapsulant 240, and does not include the third semiconductor die 160 and the conductive wires 170. Thus, the semiconductor device 200 will now be described with respect to the interposer 210, the first encapsulant 220, the second semiconductor die 230, and the second encapsulant 240.

Referring to FIG. 2, the semiconductor device 200 includes a first semiconductor die 110, a first redistribution part 130, a second redistribution part 140, the interposer 210, the first encapsulant 220, the second semiconductor die 230, and the second encapsulant 240.

The interposer 210 is disposed between the first semiconductor die 110 and the first redistribution part 130 to electrically connect the first semiconductor die 110 and the first redistribution part 130 to each other. The interposer 210 may include a silicon substrate having a circuit pattern, a circuit tape, a circuit film, or an equivalent thereof, but is not limited thereto.

The interposer 210 has: a first interface 210a that is approximately planar and faces a second surface 110b of the first semiconductor die 110; a second interface 210b that is approximately planar and opposed to the first interface 210a; and a third interface 210c that is approximately planar and connects the first and second interfaces 210a and 210b to each other.

The interposer 210 includes inter through electrodes 211 passing through a portion between the first and second interfaces 210a and 210b. A portion of the inter through electrodes 211 connects to first conductive bumps 113, and another portion thereof connects to first upper pads 131, so as to electrically connect first through electrodes 112 to a first redistribution layer 133.

The first encapsulant 220 is similar to the first encapsulant 120 of FIG. 1. However, the first encapsulant 220 is formed on the second and third surfaces 110b and 110c of the first semiconductor die 110, and the first and third interfaces 210a and 210c of the interposer 210.

The first encapsulant 220 protects the first semiconductor die 110 and the interposer 210, and provides the lower portion of the interposer 210 and the upper portion of the first semiconductor die 110 with spaces in which the first and second redistribution parts 130 and 140 greater in width than the first semiconductor die 110 can be disposed. The first encapsulant 220 may be formed of any one selected from a typical epoxy resin, a typical silicone resin, and an equivalent thereof through a molding process.

The second semiconductor die 230 is disposed over the second redistribution part 140, and is electrically connected to the second redistribution part 140 through second conductive bumps 235 connecting to a second redistribution layer 142. The second semiconductor die 230 may be a typical semiconductor die electrically connected to the second redistribution part 140 by the second conductive bumps 235, but is not limited thereto. The second semiconductor die 230 is smaller in width than the second redistribution part 140.

The second encapsulant 240 encloses and protects the second semiconductor die 230 over the second redistribution part 140. The second encapsulant 240 may be formed of any one selected from a typical epoxy resin, a typical silicone resin, and an equivalent thereof through a molding process.

As described above, the semiconductor device 200 includes the first and second redistribution parts 130 and 140 greater in width than the first semiconductor die 110, on the upper and lower sides of the first semiconductor die 110 and the interposer 210 to replace a typical thick printed circuit board, thereby performing a fan-out operation for input/output signals, and decreasing a height of the semiconductor device 200. Furthermore, the semiconductor device 200 may form a short electrical path.

In addition, since the semiconductor device 200 includes the interposer 210 mounted between the first semiconductor die 110 and the first redistribution part 130, signal processing performance thereof can be improved.

According to the embodiments, the semiconductor device includes the first and second redistribution parts greater in width than the first semiconductor die, on the upper and lower sides of the first semiconductor die to replace a typical thick printed circuit board, thereby performing a fan-out operation for input/output signals, and decreasing a height of the semiconductor device. Furthermore, the semiconductor device can form a short electrical path.

Korean Patent Application No. 10-2011-0038849 filed on Apr. 26, 2011, in the Korean Intellectual Property Office, and entitled: "SEMICONDUCTOR DEVICE" is incorporated by reference herein in its entirety.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A semiconductor device comprising:
 a first active semiconductor die comprising:
  a first surface;
  a second surface opposed to the first surface;
  a third surface coupling the first and second surfaces to each other;
  a first bond pad coupled to the first surface; and
  a first through electrode passing between the first surface and the second surface and electrically coupled to the first bond pad;
 a first encapsulant coupled to at least the third surface;
 a first redistribution part electrically coupled under the second surface and comprising a first redistribution layer electrically coupled to the first through electrode; and
 a second redistribution part coupled over the first surface and comprising a second redistribution layer electrically coupled to the first bond pad, where the second redistribution part is disposed on the first surface of the first active semiconductor die and on a surface of the first encapsulant.

2. The semiconductor device of claim 1, wherein the first redistribution part is electrically coupled to the first through electrode of the first active semiconductor die under the second surface of the first active semiconductor die through an interposer.

3. The semiconductor device of claim 2, wherein the interposer is an inactive silicon die comprising interconnection traces formed thereon.

4. The semiconductor device of claim 2, wherein the first redistribution part comprises:
 a first upper pad electrically coupled between the first through electrode and the first redistribution layer through the interposer;
 a first passivation layer coupled under the first encapsulant to expose the first upper pad; and
 a first dielectric layer coupled under the first passivation layer to cover the first redistribution layer,
 wherein the first redistribution layer passes through the first passivation layer, and extends along a bottom of the first passivation layer, and
 a portion of the first redistribution layer is exposed to a lower side of the first dielectric layer.

5. The semiconductor device of claim 4, wherein the first redistribution part comprises:
 a first lower pad coupled under the first dielectric layer to electrically couple to the first redistribution layer; and
 a solder ball coupled to the first lower pad.

6. The semiconductor device of claim 4, wherein the second redistribution part comprises:
 a second passivation layer disposed on the first surface of the first active semiconductor die and a top surface of the first encapsulant; and
 a second dielectric layer coupled over the second passivation layer to cover the second redistribution layer,
 wherein the second redistribution layer passes through the second passivation layer, and extends along a top of the second passivation layer, and
 a portion of the second redistribution layer is exposed to an upper side of the second dielectric layer.

7. The semiconductor device of claim 6, wherein the first redistribution part and the second redistribution part each independently fan out connections to the first active semiconductor die in a direction parallel to the first surface of the first active semiconductor die and beyond a footprint of the first active semiconductor die.

8. The semiconductor device of claim 1, comprising:
 a second semiconductor die coupled over the second redistribution part; and
 conductive bumps for electrically coupling the second redistribution layer and the second semiconductor die to each other,
 wherein the second semiconductor die is electrically coupled to the first active semiconductor die through the second redistribution part without an intermediate printed circuit board.

9. The semiconductor device of claim 8, wherein the second semiconductor die is smaller in width than the second redistribution part.

10. The semiconductor device of claim 8, wherein the second semiconductor die is a flip-type die.

11. The semiconductor device of claim 8, wherein the second semiconductor die is larger in width than the first semiconductor die.

12. The semiconductor device of claim 8, comprising a second encapsulant coupled over the second redistribution part to enclose the second semiconductor die.

13. The semiconductor device of claim 1, wherein the first and second redistribution parts are greater in width than the first semiconductor die.

14. The semiconductor device of claim 8, wherein the second semiconductor die is smaller in width than the second redistribution part.

15. A semiconductor device comprising:
a first semiconductor die comprising:
    a first surface;
    a second surface opposed to the first surface;
    a third surface coupling the first and second surfaces to each other;
    a first bond pad coupled to the first surface; and
    a first through electrode passing between the first surface and the second surface and electrically coupled to the first bond pad;
a first encapsulant coupled to the second surface and the third surface;
a first redistribution part comprising a first redistribution layer;
an interposer coupled between the first semiconductor die and the first redistribution part, and that comprises an inter through electrode for electrically coupling the first through electrode and the first redistribution layer to each other; and
a second redistribution part coupled over the first surface and comprising a second redistribution layer electrically coupled to the first bond pad, where the second redistribution part comprises a surface that is disposed on and directly contacts the first surface of the first semiconductor die and a surface of the first encapsulant.

16. The semiconductor device of claim 15, wherein:
the interposer is an inactive silicon die comprising interconnection traces formed thereon;
the interposer has a first interface facing the second surface of the first semiconductor die, a second interface opposed to the first interface, and a third interface coupling the first and second interfaces to each other; and
the inter through electrode passes between the first and second interfaces.

17. The semiconductor device of claim 16 wherein the first encapsulant is coupled to the first and third interfaces of the interposer.

18. A method of forming a semiconductor device comprising:
providing a first active semiconductor die comprising:
    a first surface;
    a second surface opposed to the first surface;
    a third surface coupling the first and second surfaces to each other;
    a first bond pad coupled to the first surface; and
    a first through electrode passing between the first surface and the second surface and electrically coupled to the first bond pad;
forming a first encapsulant coupled to at least the third surface;
electrically coupling a first redistribution layer of a first redistribution part to the first through electrode; and
electrically coupling a second redistribution layer of a second redistribution part to the first bond pad, where the second redistribution part is disposed on the first surface of the first active semiconductor die and on a surface of the first encapsulant.

19. The method of claim 18, wherein the first and second redistribution parts are greater in width than the first semiconductor die, and each of the first and second redistribution parts independently fan out connections to the first active semiconductor die in a direction parallel to the first surface of the first active semiconductor die and beyond a footprint of the first active semiconductor die.

20. The method of claim 18, wherein the electrically coupling a first redistribution layer of a first redistribution part to the first through electrode comprises coupling an interposer between the first semiconductor die and the first redistribution part, wherein the interposer is an inactive silicon die comprising interconnection traces formed thereon and an inter through electrode for electrically coupling the first through electrode and the first redistribution layer to each other.

* * * * *